United States Patent [19]

Scheiber

[11] 4,251,397

[45] Feb. 17, 1981

[54] VEHICLE FOR THICK FILM RESISTORS FIREABLE IN NONOXIDIZING ATMOSPHERE

[75] Inventor: David H. Scheiber, Wilmington, Del.

[73] Assignee: E. I. Du Pont de Nemours and Company, Wilmington, Del.

[21] Appl. No.: 934,271

[22] Filed: Aug. 16, 1978

[51] Int. Cl.³ .............................................. H01B 1/06
[52] U.S. Cl. .................................... 252/521; 252/518
[58] Field of Search ................................ 252/521, 518

[56] References Cited

U.S. PATENT DOCUMENTS 3,770,478  11/1973  Bishop ............................ 428/483 X

FOREIGN PATENT DOCUMENTS 1282023  7/1972  United Kingdom .

OTHER PUBLICATIONS

Valeev, Kh. S. et al., Chemical Abstracts 85 (1976), 135965u, "Semi-Conductor Ceramic Material for Producing Volume-Type Resistors."

Smirnov, M. A. et al., Chemical Abstracts 79 (1973), 109218j, "Resistance Material Made of Lanthanum Hexaboride and Glass."

*Primary Examiner*—Benjamin R. Padgett
*Assistant Examiner*—J. L. Barr

[57] ABSTRACT

Vehicles useful for thick film resistors fireable in nonoxidizing atmosphere, which are based on copolymers of ethylene and vinyl acetate, are provided. Pastes based on such vehicles, hexaboride conductors, and nonreducible glasses have high viscosity, good printability, and have no carbonaceous residue upon firing.

5 Claims, No Drawings

VEHICLE FOR THICK FILM RESISTORS FIREABLE IN NONOXIDIZING ATMOSPHERE

DESCRIPTION

1. Technical Field

This invention relates to vehicles for thick film resistor compositions and more particularly to vehicles based on ethylene-vinyl acetate copolymers.

2. Background Art

Thick film compositions utilized for screen printing microelectronic circuit elements comprise particulate solids and a vehicle. While any inert liquid can be used as a vehicle, most commonly the vehicle is a solution of a polymeric binder in a solvent.

Screen printing is often accomplished by transporting a thick film paste across the top of a fine mesh screen having masked and unmasked areas on the bottom surface using a resilient squeegee. As the paste passes over the unmasked areas of the screen, some of it is pushed through the open mesh onto the surface of the substrate which is being coated, said substrate being held in close proximity to the bottom surface of the screen. At the completion of the paste transport process, the thin layer of paste transferred to the substrate should replicate exactly the lateral dimensions of the openings through which it was delivered. These paste-coated areas are often quite small in length and/or width, attaining dimensions of 0.005 inch or less. It is desirable that the wet, imaged areas not only accurately replicate the pattern in the screen during printing, but also maintain their as-printed size upon standing and while drying at an elevated temperature. Furthermore, it is generally desirable that the initially roughened surface of the print, arising from the effects of wire mesh of the screen, flow out so that a relatively smooth surface, free of pinholes and other gross irregularities, results. It is known that the polymeric binder present in the liquid phase of the thick film composition is critical in compounding materials which, despite their high viscosity of $10^2$–$10^3$ pascal seconds flow easily through the fine mesh openings, maintain their as-printed geometry yet level adequately to form a smooth print.

While a large variety of soluble organic resins is available for use in thick film compositions, good overall rheological properties can be obtained with ethyl cellulose-type polymers and these resins have been widely used in commercial practice.

After printing and drying, thick film circuit elements are typically fired in air at temperatures of about 700° C. to about 1000° C. during which operation the remaining organic constituents are burned away and the particulate materials sinter into a coherent structure and adhesion is developed between the circuit element and the substrate upon which it resides. During firing, the organic phase should be readily and completely oxidized and the gaseous products of combustion allowed to escape without forming bubbles or other defects in the printed areas. These requirements are routinely met with the ethyl cellulose-type polymers and many other polymers, such as polystyrene, polyacrylates, and polymethacrylates. In other words, burnout of organic binders and flow modifiers is generally not a serious problem in formulating air-fireable thick film compositions, provided that an adequate supply of air is available to those zones of the firing furnace wherein reaction of binder and oxygen can take place.

For many years, the metal powders used to generate conductors from thick film pastes for use in microelectronic circuitry have been chosen based on their resistance to oxidation during air firing. Therefore Au, Ag, Pt, Pd and other noble metals have been used. While excellent performance has been obtained, such metals are of high cost. To reduce cost, new conductor compositions have recently been developed based on nonnoble metals, such as copper and nickel. Because these materials are sensitive to oxygen and would form nonconducting oxides during firing at the temperatures required for sintering, firing is done in nitrogen or other nonoxidizing atmospheres. Hybrid microcircuits often contain functional elements, such as resistors and dielectrics, in addition to conductors. If the conductors present are base metal and intolerant of oxygen at high temperatures, then such resistors and dielectrics must also be fireable in an inert atmosphere. Nitrogen, being readily available and low in cost, is the atmosphere of choice when air cannot be used.

Ethyl cellulose resins can be used to provide good printability in these conductor, dielectric and resistor compositions just as they are used for air-fired compositions. However, when these resins are decomposed at elevated temperatures in nonoxidizing (substantially oxygen-free) atmospheres, a char is formed because complete conversion to gaseous products does not take place in the absence of oxygen. Often this carbonaceous char interacts with the inorganic constituents of the thick film compositions and adversely affect the properties of the fired film. A particularly useful class of materials for obtaining copper compatible resistors fireable in nonoxidizing atmospheres is based on metal hexaborides. These compounds are very reactive materials and the electrical properties of resistors made from them, usually in admixture with a suitable adhesion-promoting glass, are adversely affected by the presence of even small amounts of the char that can remain if the binder present in the composition is not substantially completely decomposed and removed during firing.

Attempts have been made to use solvent soluble, vinyl addition-type polymers to replace ethyl cellulose resins. Polymers are known which decompose relatively cleanly in nitrogen at elevated temperatures and do not form a substantial char which can interact with the functional elements of a thick film composition. Representative polymers are poly-alpha-methylstyrene, polyisobutylene, polymethyl methacrylate, and various other substituted methacrylate homo- and copolymers. Such vinyl addition-type polymers, however, often do not provide pastes of thick film compositions having good printability and produce fired circuit elements which are usually unsatisfactory in those performance characteristics which are dependent upon accurately defined, uniform, and smooth fired prints.

Ethylene-vinyl acetate-based compositions have also been utilized in screen printing applications.

U.S. Pat. No. 3,770,478, issued Nov. 6, 1973, to J. J. Bishop, discloses silk-screening of organic solvent-based pigmented coatings. The coatings contain ethylene-vinyl acetate emulsions as a binder.

U.S. Pat. No. 3,359,154, issued Dec. 19, 1967, to M. A. J. Clark, discloses inks for silk screening containing "carboxyl-modified polyolefin wax" and a peroxide.

U.S. Pat. No. 3,824,118, issued July 16, 1974, to M. Tsuboi, et al., discloses ink sheets for stencil printing process which contain ethylene-vinyl acetate polymers.

These polymers are insoluble at room temperature in the solvent systems utilized.

None of the above-mentioned patents discloses compositions useful for thick film compositions in general nor is there any mention of ethylene-vinyl acetate as a useful polymeric vehicle for resistor compositions meeting the above-described requirements.

DISCLOSURE OF THE INVENTION

The thick film resistor and conductor compositions of this invention are compatible with copper metallization conductors, are fireable in nonoxidizing atmosphere, and consist essentially of a mixture of inorganic powders containing conductive material such as lanthanum hexaboride (LaB$_6$), yttrium hexaboride (YB$_6$), the rare earth hexaborides, calcium hexaboride (CaB$_6$), barium hexaboride (BaB$_6$), strontium hexaboride (SrB$_6$), or mixtures thereof and a nonreducible glass having a Gibbs free energy of formation, $\Delta F°$, at 900° C., of less than approximately $-78$ kcal/mole (per each metal-oxygen bond in the molecule), dispersed in an inert liquid vehicle such as based on copolymers of ethylene-vinyl acetate having not less than 53% by weight of vinyl acetate.

The ethylene-vinyl acetate polymers contain at least 53% by weight of vinyl acetate for room temperature solubility in appropriate solvents and have relatively high molecular weights characterized by melt flow rates (ASTM Procedure D-1238-73) of 0.1–2.0 gram/10 min.

The weight ratio in the solids of the hexaboride to glass is from 10:90 to 95:5 while the weight ratio of solids to vehicle is from 1:2 to 20:1.

Optionally, the compositions may also contain fillers or other nonreacting particulate inorganic materials and organic additives to further improve flow properties and dispersibility.

DESCRIPTION OF THE INVENTION

The inert liquid vehicle of this invention is based on ethylene-vinyl acetate copolymers containing at least 53% by weight of vinyl acetate.

It was found unexpectedly that certain high molecular weight ethylene-vinyl acetate copolymers, in addition to affording thick film compositions in which no substantial amount of char remains upon firing in a nonoxidizing atmosphere, lead to compositions with improved flow properties. Such an improvement, in turn, yields screen printed areas of small dimensions with good flow and leveling from high viscosity pastes.

These findings are in contrast with the known state of art. A variety of organic solvent soluble polymers are known to decompose cleanly when heated (fired) in a substantially nonoxidizing atmosphere. Among these polymers are the acrylate and methacrylate polymers, having the following generalized structure:

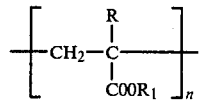

where R is hydrogen or methyl and R$_1$ includes alkyl groups such as methyl. It is also known, however, that thick film pastes based on such vehicles do not have the necessary rheological properties to produce commercially satisfactory thick film prints of small dimensions. Specifically, such vehicles form high viscosity pastes with large quantities of inorganic powders, the pastes having poor flow and leveling giving rise to printed areas which, after drying and firing, have rough surfaces. This nonuniformity, in turn, can lead to resistors which are difficult to trim rapidly to uniform resistance values with a laser trimmer.

The ethylene-vinyl acetate copolymers of this invention are structurally similar, in an empirical sense, to the (meth)acrylate polymers shown above in that they contain similar structural elements:

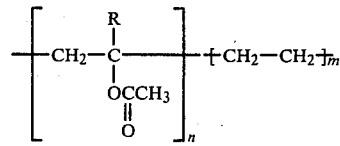

where R is hydrogen. Such a similarity can be expected to lead to certain similarities in properties. However, as was stated above, certain ethylene-vinyl acetate polymers did lead to thick film pastes different in properties from those based on other polymers.

The ethylene-vinyl acetate (EVA) polymers utilized in the liquid vehicles of this invention have sufficiently high molecular weights to be tough but deformable at room temperature. Polymers having melt flow rates of 0.1–2 gram/10 minutes (ASTM Procedure D-1238-73) are satisfactory. The preferred range is 0.25–1.5.

The vinyl acetate content of these polymers is controlled by solubility requirements. The amount of vinyl acetate present is such that the EVA polymer is soluble at room temperature in solvents suitable for thick film printing. Such solvents include beta-terpineol, monoalkyl and monoaryl ethers of ethylene, diethylene, propylene, and dipropylene glycols, and the monoacetates of the above. The alkyl groups referred to above are C$_{1-6}$ normal, branched or cycloaliphatic groups. The solvents further include benzyl alcohol, toluene, 2,2,4-trimethylpentanediol-1,3-monoisobutyrate, and trichloroethylene.

To achieve room temperature solubility, the necessary minimum level of vinyl acetate in EVA is 53% by weight. Less vinyl acetate can be incorporated if the screen printing paste is to be used at an elevated temperature, but this is generally not preferred because of more rapid evaporation of the solvent and the need to prevent high levels of solvent vapor buildup in the vicinity of the screen printing equipment. Less vinyl acetate can also be used in certain specific solvents of the types disclosed above, but it is preferred that solubility be sufficiently broad that pastes having a wide range of properties such as viscosity and drying rate can be prepared.

While any vinyl acetate content above 53% can be used, it is preferred to keep the vinyl acetate level between about 53% and 70%, and more preferably between 53 and 65%, to assure that char is not produced during firing in a nonoxidizing atmosphere. It has been found that as the vinyl acetate content is increased significantly above about 60%, the amount of char produced tends to gradually increase, thus reducing the advantage inherent in the use of the vinyl acetate/ethylene copolymer.

Suitable polymers include ethylene/vinyl acetate//45/55 (by weight, melt flow rate=1.0 g/10 min.), ethylene/vinyl acetate//40/60 (by weight, melt flow rate=0.3–0.4 g/10 min.), and ethylene/vinyl acetate//40/60 (by weight, melt flow rate=1.0–1.2 g/10 min.). These materials are commercially available under the names of "Vynathene" 906, 907, and 909, respectively, from the U.S. Industrial Chemicals Company.

Although copolymers of vinyl acetate and ethylene are preferred, similar polymers derived from other $\beta$-olefins, such as propylene or isobutylene, and other vinyl esters, such as vinyl formate or vinyl butyrate, can also be used. In such cases, adjustment of the preferred weight percents of the hydrocarbon and vinyl ester monomers is made based on the molecular weights of the monomers so as to keep the mole ratios within the desired range, i.e., from about 26 to about 43 mole% vinyl ester.

The EVA polymers usually comprise 2–15% of the inert liquid vehicle of this invention and preferably 3–10%. The weight ratio of the vehicle to the solids content of the composition of this invention is from 2:1 to 1:20.

The inorganic solids content of the resistor and conductor composition of this invention contains 10–95 parts by weight, based on the solids content, of a conductive material such as $LaB_6$, $YB_6$, the rare earth hexaborides, $CaB_6$, $BaB_6$, $SrB_6$ or mixtures thereof. These conductive materials are fully described in a copending application to P. C. Donohue, Ser. No. 934,269, filed Aug. 16, 1978 concurrently with the instant application, and is hereby incorporated by reference.

Although the above empirical formulae are used throughout this description, it is understood that the stoichiometry of these compounds is somewhat variable and is thought to be, e.g., for lanthanum hexaboride, $La_{0.7-1}B_6$.

Depending on the amount of hexaboride and the complementary amount of nonreducible glass, the compositions fulfill the function of either that of resistor or that of conductor. For the sake of simplicity, these compositions will be referred to as resistor compositions.

Among the hexaboride conductors the preferred one is lanthanum hexaboride.

In order to obtain low coefficient of variation and good surface smoothness, the hexaboride particle size must be below one micrometer (micron). Preferably, the average particle size is between $0.055\mu$ and $0.32\mu$ and, even more preferably, the average particle size is approximately $0.2\mu$. The particle size referred to above can be measured by a Coulter Counter or can be calculated, assuming spherical particles, from the equation below.

$$\text{particle diameter } (\mu) = \frac{6}{\text{surface area (m}^2\text{/g)} \times \text{density (g/cm}^3\text{)}}$$

The surface area can be determined by customary methods such as measuring volume of gas adsorbed after equilibrium gas adsorption by the particles. For $LaB_6$, the density is 4.72 g/cm$^3$. Substituting into the above equation, the surface area for $LaB_6$ has to be larger than approximately 1 m$^2$/g, while the preferred surface area range is approximately 4–23 m$^2$/g, with the more preferred value being approximately 6 m$^2$/g. To obtain the fine particle size hexaborides of this invention from commercially available coarser materials, e.g., 5.8 for $LaB_6$, they are usually vibratorily milled. Vibratory milling is carried out in an aqueous medium by placing the inorganic powder and alumina balls into a container which is then vibrated for a specified length of time to achieve the desired particle size.

The inorganic solids content of the resistor composition of this invention contains 90–5 parts by weight, based on the solids content, of a nonreducible glass and preferably 50–15 parts. This nonreducible glass is also fully described in the above-mentioned copending application to P. C. Donohue. The relative amounts of hexaboride to glass are determined by the desired final resistivity of the thick film resistors.

Hexaborides such as $LaB_6$ are strong reducing agents; their reaction with metal oxides (MO) is shown below:

$$LaB_6 + 10.5MO \rightarrow 0.5La_2O_3 + 3B_2O_3 + 10.5M$$

Based on thermodynamic calculations and approximations, the Gibbs free energy of formation, $\Delta F°$, will be zero (at 900° C., the approximate average temperature at which the thick film resistor films are formed from the compositions of this invention) when $\Delta F°$ (M—O) is approximately −80.8 kcal/mole. (The thermodynamic data utilized herein are based on tabulations in Bulletin 542, Bureau of Mines, "Contributions to the Data on Theoretical Metallurgy: XII. Heats and Free Energies of Formation of Inorganic Oxides" by J. P. Coughlin, 1954. $\Delta F°_{LaB_6}$ was estimated to be approximately 10% less than its reported $\Delta H°$ of −30.7 kcal/mole; see Chem. Abstr., 70:61844 v.) Based on the above equation and on data from the tabulation:

$$-28 \text{ kcal/mole} + 10.5 \Delta F.° (M - O) \rightarrow$$
$$0.5 (-344 \text{ kcal/mole}) + 3(-234.7 \text{ kcal/mole}) + 0$$
$$\Delta F.° (M - O) = -80.8 \text{ kcal/mole}.$$

When such nonreducible glasses are utilized in the compositions of this invention, resistors having superior electrical properties, especially temperature coefficient of resistance (TCR), can be obtained.

Excessive deviation of TCR values from zero can be caused by several factors, but very high negative TCR values can result from the incomplete burning, in a nonoxidizing atmosphere, of the prior art vehicles, such as ethyl cellulose, which leads to residual carbon. The EVA polymeric vehicles of this invention minimize or alleviate this problem.

TCR is an important characteristic of electrical resistors. In general, thick film resistor compositions have, unless modified, relatively large positive TCR values at the low resistivity range of the resistor films and negative values in the high resistivity range. Such behavior is thought to occur because of the domination of the metallic functional phase in the low resistivity range while, in the high resistivity range, the semi-conducting characteristics of the functional phaseglass junctions dominate.

The resistor compositions of this invention generally afford resistors of acceptable TCR. Although no absolute maximum acceptable TCR values have been generally established, it is thought that resistors having a TCR value outside of the ±350 ppm/°C. range, without TCR modifiers, are unacceptable. Especially effective TCR modifiers for the resistor compositions of this invention are described in copending patent application Ser. No. 934,270, filed Aug. 16, 1978 and is hereby incorporated by reference. These modifiers include TiO, Ge, Si and C. These can be included to the extent of 1–20 parts by weight based on the inorganic solids.

Among component oxides of the nonreducible glasses are the following, showing the $\Delta F°$ (M—O) values at 1200° K. in kcal/mole per metal-oxygen bond in parentheses: CaO(-121), ThO$_2$(-119), BeO (-115), La$_2$O$_3$(-115), SrO(-113), MgO(-112), Y$_2$O$_3$ (-111), rare earth oxides, Sc$_2$O$_3$(-107), BaO(-106), HfO$_2$(-105), ZrO$_2$(-103), Al$_2$O$_3$(-103), Li$_2$O(-103), TiO(- 97), CeO$_2$(-92), TiO$_2$(-87), SiO$_2$(-80), B$_2$O$_3$(-78). SiO$_2$ and B$_2$O$_3$ are borderline in reducibility in this scheme but probably receive additional stabilization during glass formation and therefore can be included.

Representative reducible oxides permitted to be present in the nonreducible glasses of this invention to a small extent not to exceed approximately 2 mole%, are listed below: Cr$_2$O$_3$(-65), Na$_2$O(-59), ZnO(-53), K$_2$O(-37), CdO(-28), PbO(-24), Bi$_2$O$_3$(-19).

Preferred glasses are listed below (mole% range): M O (10-30, M is Ca, Sr, Ba), SiO$_2$(35-55), B$_2$O$_3$(20-35), Al$_2$O$_3$(5-15), ZrO$_2$(0-4), TiO$_2$(0-1), Li$_2$O(0-2). Calcium is the preferred M . An expecially preferred glass is prepared from (mole %) CaO(12.7), SiO$_2$(46.66), B$_2$O$_3$(25.4), Al$_2$O$_3$(12.7), ZrO$_2$(2.03), and TiO$_2$(0.522).

These glasses are prepared by conventional glassmaking techniques, by mixing the desired components (or precursors thereof, e.g., H$_3$BO$_3$ for B$_2$O$_3$) in the desired proportions and heating the mixture to form a melt. As is well known in the art, heating is conducted to a peak temperature and for a time such that the melt becomes entirely liquid, yet gaseous evolution has ceased. In this work, the peak temperature is in the range 1100°-1500° C., usually 1200°-1400° C. The melt is then fritted (particles are made) by cooling the melt, typically by pouring onto a cold belt or into cold running water. Particle size reduction can then be accomplished by milling as desired.

The above mentioned glass can be conveniently prepared by melting, at 1400°-1500° C. in a platinum or Kyanite crucible, the appropriate amounts of H$_3$BO$_3$, SiO$_2$, Al$_2$O$_3$. 3H$_2$O, CaCO$_3$, ZrO$_2$, and TiO$_2$. Alternatively, CaZrO$_3$ and CaTiO$_3$ can also be used as the precursors of ZrO$_2$ and TiO$_2$, respectively, and as the partial source of CaO.

The surface area of the nonreducible glasses is not cirtical but is preferably in the range of 2-4 m$^2$/g. Assuming a density of approximately 3 g/cm$^3$, this range corresponds to an approximate particle size range of 0.5-1$\mu$. A surface area of 1.5 m$^2$/g (approx. 1.3$\mu$) can also be utilized.

The hexaboride-nonreducible glass mixture of this invention is dispersed in the EVA copolymeric vehicle of this invention.

The resistor compositions are prepared from the solids and vehicles by mechanical mixing. The resistor compositions of the present invention are printed as a film onto ceramic, alumina or other dielectric substrates in the conventional manner. Generally, screen stenciling techniques are preferably employed. The resulting printed patterns are generally allowed to level out, dried at elevated temperatures such as at 120° C. for approximately 10 minutes, and fired in nonoxidizing atmosphere in a belt furnace at a peak temperature of approximately 910° C.

Preferably, a nitrogen atmosphere is employed in the furnace but other nonoxidizing gases such as hydrogen or a mixture of hydrogen and carbon monoxide can also be used. Also, small quantities of oxygen can also be present during the firing without adversely affecting the final resistor properties. It is believed that a maximum of approximately 100 parts per million of oxygen is permissible; above this level, oxygen appears to have a TCR modifier effect. It is thought that oxygen induces metal oxide formation at the conductor-conductor interfaces imparting semiconducting characteristics to regions of the compositions and thereby acting as a negative TCR modifier. It is, however, possible that depending on the exact nature of hexaboride, glass, and vehicle, higher levels of oxygen can be tolerated without any adverse effect. The preferred range of oxygen content in the nitrogen atmosphere is 3-30 ppm.

Resistance measurements can be carried out in a two-probe procedure utilizing a digital ohmmeter.

TCR measurements are carried out by measuring resistivities ($R_E$; $R_{RT}$) at elevated temperatures ($T_E$) between 125° C. and 150° C. and at room temperature ($T_{RT}$). TCR is calculated from the following formula; in units of ppm/°C:

$$TCR = \frac{R_E - R_{RT}}{R_{RT}(T_E - T_{RT})} \times 10^6$$

Often, for better comparison, the measured resistivities are normalized to a uniform thickness.

Film thickness (and, also, surface roughness of the films) is measured by a commercial instrument, the Gould surfanalyzer, which records surface profile, thickness values, and surface roughness.

Coefficient of variation (CV) is expressed in percentages and is calculated by dividing the standard deviation by the mean and multiplying by 100.

In the Examples below, illustrating the invention, all parts are by weight unless otherwise indicated.

EXAMPLES

Examples 1-3

A series of resistor compositions is prepared containing varying amounts of LaB$_6$ and nonreducible glass. The glass is based on the following constituents (mole%): B$_2$O$_3$(25.4), SiO$_2$(46.66), Al$_2$O$_3$(12.7), CaO(12.7), ZrO$_2$(2.03) and TiO$_2$(0.52). The actual ingredients are as follows: H$_3$BO$_3$(173.1 grams), SiO$_2$(154.5 grams), Al$_2$O$_3$. 3H$_2$O (109.2 grams), CaCO$_3$(70 grams), ZrO$_2$(13.8 grams), and TiO$_2$(2.3 grams). The ingredients are ball milled with alumina balls, wet, for seven hours, sifted through a 400-mesh screen, filtered and dried. After drying, the components are melted at between 1450° C. and 1500° C. in a platinum crucible and the molten glass is fritted by pouring into cold water followed by crushing and grinding by conventional wet-ball milling procedure.

LaB$_6$ utilized in these experiments is obtained commercially and vibratorily milled for 16 hours to a surface area of approximately 12 m$^2$/g. (Vibratory milling is carried out in an aqueous medium by placing inorganic powders and alumina balls into a container which is then vibrated for a specified length of time.)

The resistor compositions are prepared into paste form by dispersing LaB$_6$ and glass in the vehicle by mulling on a glass plate. The dispersions contain varying ratios of LaB$_6$ and glass as shown in the tabulation below.

The vehicle for Example 1 is a 20% by weight solution (in hexyl Carbitol) of an ethylenevinyl acetate (45/55 by weight) polymer having a melt flow rate of 1.0. The vehicle comprises 30.23% by weight of the total resistor composition. The polymer for the vehicle for Examples 2 and 3 is ethyl cellulose in hexyl Carbitol, 2.31% by weight. Ethyl cellulose has 47.5–49.0% ethoxyl content and 2.42–2.53 ethoxyl groups per anhydroglucose units. Viscosity of the ethyl cellulose, after drying for 30 min. at 100° C. is 0.022 pascal seconds in a 5% by weight solution in 80/20//toluene/ethanol (by weight) solvent system.

The Table below shows compositions of the resistor formulations:

| Example | $LaB_6$ | glass | Vehicle polymer solution | solvent (hexyl Carbitol) |
|---|---|---|---|---|
| 1 | 0.9 | 2.1 | 0.9 | 0.4 |
| 2 | 0.9 | 2.1 | 1.3 | — |
| 3 | 0.9 | 2.1 | 0.52 | 0.78 |

The resistor compositions prepared above are screen printed over prefired copper electrodes using 300-mesh screens, allowed to level for 10 minutes, dried at 120° C. for 10 minutes, and fired in a belt furnace in a nitrogen atmosphere containing 25–30 ppm of oxygen in the burn-out zone and 3–10 ppm of oxygen in the firing zone. The total firing cycle is 56 minutes, reaching a peak temperature of 910° C. for 6–8 minutes, at a rate of temperature rise and fall of approximately 80°–100° C./minute.

The resistivity values are measured as described above, the TCR values are calculated using the equation shown above, coefficient of variation (CV, %) is calculated from the equation shown above, and humidity drift is measured at 90% relative humidity at 40° C. for 100 hours. Values are tabulated below:

| Ex. | Printability | Weight Ratio (polymer/inorganic solids) | Resistivity (kiloohm/sq) | CV (%) | TCR (ppm/°C.) |
|---|---|---|---|---|---|
| 1 | acceptable | 0.06 | 0.86 | 9 | 179 |
| 2 | unacceptable | 0.01 | 3.4 | 23 | −285 |
| 3 | unacceptable | 0.004 | 4.2 | 42 | −22 |

These data show the compositions of Examples 2 and 3 to be outside of the scope of the present invention. Furthermore, it can be seen that even very small amounts of ethyl cellulose, insufficient even to provide adequate printability, cause a considerable upward shift in resistivity and a large shift in TCR in the negative direction. Sample-to-sample uniformity in resistivity is also considerably improved in Example 1 over Examples 2 and 3.

Examples 4–5

Resistor compositions are prepared based on $LaB_6$ and a glass having the following consitituents (mole%): $B_2O_3$(33.6), $SiO_2$(44.7), $Al_2O_3$(6.7), and CaO(15.0). The actual ingredients for the glass are as follows: $H_3BO_3$(61.8 grams), $SiO_2$(40.8 grams), $Al_2O_3.3H_2O$(15.6 grams), and $CaCO_3$(22.4 grams). The glass is fritted at 1400° C.

Using a muller, 0.66 g. of $LaB_6$ (surface area 12 m²/g) and 2.34 g. of the above glass are mixed with a vehicle until a smooth, well dispersed paste is formed at the highest possible total solids content.

In Example 4 the EVA polymer described in Example 1 is utilized, 0.9 gram of a 20% by weight solution in 2,2,4-trimethylpentanediol-1,3-monoisobutyrate and 0.24 gram of the same solvent.

In Example 5, the vehicle is a 26.7% by weight solution of polyiso-butyl methacrylate (inherent viscosity of 0.7 deciliter/gram, measured at 20° C. in a solution of 0.25 gram of polymer in 50 ml of chloroform) in 2,2,4-trimethylpentadiol-1,3-monoisobutyrate, 0.67 g., and 0.5 gram of the same solvent.

The compositions are printed as described above and the remaining pastes are diluted with small amounts of solvent, remulled, and printed. This procedure is repeated until the pastes become too fluid to print.

The data below show excellent electrical properties and smoother fired surfaces obtained in Example 4. Example 5 is outside of the scope of this invention:

Example 4

| inorganic solids (weight %) | surface roughness (mil) | resistivity (kiloohm/sq/mil) | TCR (ppm/°C.) |
|---|---|---|---|
| 74 | TOO DRY TO MIX | | |
| 72.4 | 0.20 | 0.68 | 104 |
| 69.8 | 0.20 | 0.76 | 114 |
| 68.1 | 0.12 | 0.90 | 107 |
| 65.7 | 0.06 | 0.99 | 100 |
| 63.4 | 0.04 | 1.02 | 96 |
| 61.6 | 0.07 | 1.30 | 99 |

These data also show that printability achieved with the ethylene-vinyl acetate polymeric vehicle of this invention is not a function of paste viscosity.

Example 5

| inorganic solids (weight %) | surface roughness (mil) | resistivity (kiloohm/sq/mil) | TCR (ppm/°C.) |
|---|---|---|---|
| 74 | TOO DRY TO MIX | | |
| 71.3 | 0.20 | 1.07 | 75 |
| 70.0 | 0.25 | 1.11 | 7.0 |
| 67.6 | 0.30 | 1.65 | 60 |
| 64.6 | 0.40 | 1.82 | 63 |
| 62.5 | 0.40 | 3.02 | 40 |
| 59.1 | 0.40 | 2.59 | 1 |

Examples 6–9

These are comparative Examples showing that vehicles based on hydrocarbon polymers also do not afford pastes of good printability and, where printable (Example 9), the fired resistors are rough.

For all four Examples, $LaB_6$, 0.79 gram and the glass utilized in Examples 4–5, 2.81 grams, are mulled with solutions of different molecular weight polyisobutylene polymers:

Example 6. Molecular weight (viscosity average): $2.1 \times 10^6$; solvent: dodecane (5% solution). Even at the low total solids of 64%, there is poor printability and no leveling of the wet print.

Example 7. Molecular weight (viscosity average): $4 \times 10^4$; solvent: dodecane (25% solution). Same results as above.

Example 8. Utilizing the polymer from Example 7, in a 25% solution in n-pentyl ether, the same results are obtained as above.

Example 9. Molecular weight (viscosity average): $9.9 \times 10^5$; solvent: 25/75 mixture of butyl carbitol/dodecane (15% solution). A paste, having a polymeric binder: inorganic solids ratio of 0.06, upon printing and firing, results in fired prints of high (0.20 mil) surface roughness having undesirable pitted areas over terminations.

Examples 10-12

Resistor compositions are prepared based on a glass having the following constitutents (mole%): $B_2O_3(25.0)$, $SiO_2(46.0)$, $Al_2O_3(12.5)$, $CaO(10.5)$, $ZrO_2(4.0)$, $PbO(2.0)$. The actual ingredients are as follows: $H_3BO_3$(247.3 grams), $SiO_2$(220.8 grams), $Al_2O_3\cdot 3H_2O$(156 grams), $CaCO_3$(84 grams), $ZrO_2$(39.4 grams), and PbO(35.7 grams). The glass is prepared at approximately 1500° C. A series of resistor compositions is prepared by mixing together $LaB_6$, having a surface area of 10 m²/g and the above-described glass at various levels, and an ethylenevinyl acetate-based vehicle as described in Examples 1-3, dissolved in 2,2,4-trimethylpentadiol-1,3-monoisobutyrate. The table below shows compositions and the weight percents in parentheses:

| Example | $LaB_6$ | glass | Vehicle (16.7% by wt. solution) |
|---|---|---|---|
| 10 | 0.84 (19.9) | 2.16 (51.2) | 1.22 (28.9) |
| 11 | 0.72 (17.0) | 2.28 (54.0) | 1.22 (28.9) |
| 12 | 0.69 (16.3) | 2.31 (54.7) | 1.22 (28.9) |

Electrical data for the above resistors are shown in the tabulation below; the incipient gloss temperature of the glass utilized herein is 800° C.

| Ex. | Resistivity (kiloohms/ square) | TCR (ppm/ °C.) | CV (%) | Humidity Drift (%) | Thickness (mil) | Roughness (mil) |
|---|---|---|---|---|---|---|
| 10 | 0.3867 | 335 | 5.6 | 0.08 | 1.1 | 0.1 |
| 11 | 1.948 | 226 | 16.5 | 0.31 | 1.1 | 0.1 |
| 12 | 6.230 | 160 | 7.0 | 0.45 | — | — |

I claim:

1. A resistor and/or conductor composition consisting essentially of inorganic powder solids content dispersed in an organic vehicle wherein the weight ratio of solids content to vehicle is from 1:2 to 20:1 and wherein the solid content consists essentially of:
   A. 10-95 parts by weight, based on the weight of solids, of conductive material selected from the group consisting of $LaB_6$, $YB_6$, rare earth hexaborides, $CaB_6$, $BaB_6$ and $SrB_6$; and
   B. 90-5 parts by weight, based on the weight of solids, of at least 98 mole%, based on the mole% of the oxide components of the glass, of nonreducible glass, each component having a Gibbs free energy of formation at 900° C. of less than approximately −78 kcal/mole per each metal-oxygen bond in the molecule;
   wherein the organic vehicle is based on copolymers of 57-74 mole% α-olefins of up to and including four carbon atoms and 26-43 mole% vinyl esters of acids containing up to and including four carbon atoms, said copolymers are soluble in solvents suitable for thick film printing; and
   wherein the composition is fireable in substantially nonoxidizing atmosphere.

2. The composition of claim 1 wherein said copolymer is an ethylene-vinyl acetate copolymer containing not less than 53% by weight of vinyl acetate and having melt flow rate, as measured by ASTM Procedure D-1238-73 of 0.1-2.0 gram/10 minutes.

3. The composition of claim 2 wherein said copolymer has a melt flow rate of 0.25-1.5 gram/10 minutes.

4. The composition of claim 2 wherein said copolymer contains 53-70% by weight of vinyl acetate.

5. A resistor and/or conductor composition consisting essentially of inorganic powder solids content dispersed in an organic vehicle wherein the weight ratio of solids content to vehicle is from 1:2 to 20:1 and wherein the solids content consists essentially of
   A. 10-95 parts by weight, based on the weight of solids, of $LaB_6$ having an average particle size below 1 micron; and
   B. 90-5 parts by weight, based on the weight of solids, of at least 98 mole%, based on the mole% of the oxide components of the glass, of nonreducible glass, each component having a Gibbs free energy of formation at 900° C. of less than approximately −78 kcal/mole per each metal-oxygen bond in the molecule;
   wherein the organic vehicle is based on copolymers of ethylene and vinyl acetate containing not less than 53% by weight of vinyl acetate and having a melt flow rate, as measured by ASTM Procedure D-1238-73, of 0.1-2.0 gram/10 minutes; and
   wherein the composition is fireable in substantially nonoxidizing atmosphere.

* * * * *